United States Patent [19]
Cho et al.

[11] 3,915,765
[45] Oct. 28, 1975

[54] MBE TECHNIQUE FOR FABRICATING SEMICONDUCTOR DEVICES HAVING LOW SERIES RESISTANCE

[75] Inventors: Alfred Yi Cho, New Providence; Franz Karl Reinhart, Summit, both of N.J.

[73] Assignee: Bell Telephone Laboratories, Incorporated, Murray Hill, N.J.

[22] Filed: June 25, 1973

[21] Appl. No.: 373,023

[52] U.S. Cl. ................ 148/175; 156/610; 156/612; 204/192; 357/16; 357/18; 357/30

[51] Int. Cl.[2] ............ H01L 21/203; H01L 21/363; H01L 29/205

[58] Field of Search ........ 148/174, 175; 117/106 A, 117/212, 213, 215; 204/192; 357/30, 16

[56] References Cited

UNITED STATES PATENTS

| | | | |
|---|---|---|---|
| 3,473,978 | 10/1969 | Jackson et al. | 148/175 |
| 3,721,583 | 3/1973 | Blakeslee | 117/106 A X |
| 3,751,310 | 8/1973 | Cho | 148/175 |
| 3,783,009 | 1/1974 | Tramposch | 117/106 A |
| 3,821,777 | 6/1974 | James | 357/39 |

OTHER PUBLICATIONS

Cho et al., "Magnesium–Doped GaAs and $Al_xGa_{1-x}$ as by Molecular Beam Epitaxy," J. Appl. Phys., Vol. 43, No. 12, Dec. 1972, pp. 5118–5123.

Tietjen et al., "Preparation .... $GaAs_{1-x}P_x$ using Arsine & Phosphine, " J. Electrochem. Soc., Vol. 113, No. 7, July 1966, pp. 724–728.

Blakeslee, A. E., "Vapor Growth of a Semiconductor Superlattice," J. Electrochem. Soc., Vol. 118, No. 9, Sept. 1971, pp. 1459–1463.

Chang et al., "Fabrication for Multilayer Semiconductor Devices," IBM Tech. Discl. Bull., Vol. 15, No. 2, July 1972, pp. 365–366.

Green et al., "Method to Purify Semiconductor Wafers," IBM Tech. Discl. Bull., Vol. 16, No. 5, Oct. 1973, pp. 1612–1613.

Alferov et al., "AlAs–GaAs .... Room–Temperature Threshold," Soviet Physics – Semiconductors, Vol. 3, No. 9, Mar. 1970, pp. 1107–1110.

Cho, A. Y., "Growth of Periodic Structures by Molecular–Beam–Method," Applied Physics Letters, Vol. 19, No. 11, Dec. 1971, pp. 467–468.

Dumke et al., "Double Heterojunction GaAs Injection Laser," IBM Tech. Discl. Bull., Vol. 15, No. 6, Nov. 1972, p. 1998.

*Primary Examiner*—L. Dewayne Rutledge
*Assistant Examiner*—W. G. Saba
*Attorney, Agent, or Firm*—M. J. Urbano

[57] ABSTRACT

In order to fabricate by MBE semiconductor devices, such as junction lasers and light modulators or varactor and impatt diodes, having relatively low series resistance one or more of the following three steps are executed: (1) on the substrate a high conductivity buffer layer is first grown having the same conductivity-type as the substrate; (2) beginning with the high conductivity layer and until all semiconductor layers of the device are fabricated, the growth process is made to be continuous; and (3) the substrate is heated just prior to the growth of the high conductivity layer and under excess pressure of any element in the substrate which has a relatively high vaporization pressure and which tends to evaporate from the heated substrate. Preferably all three steps are performed.

16 Claims, 7 Drawing Figures

MBE TECHNIQUE FOR FABRICATING SEMICONDUCTOR DEVICES HAVING LOW SERIES RESISTANCE

BACKGROUND OF THE INVENTION

This invention relates to the fabrication of semiconductor devices by molecular beam epitaxy (MBE).

In U.S. Pat. No. 3,615,931 granted to J. R. Arthur, Jr. (Case 3) on Oct. 26, 1971 and assigned to the assignee hereof, there is described a comparatively new technique for the epitaxial growth of thin films of semiconductor materials, in which growth results from the simultaneous impingement of one or more molecular beams of the constituent elements onto a heated substrate. In particular the Arthur patent describes the basic MBE process for growing Group III (*a*)–V(*a*) thin films on a substrate preheated to a temperature within the range of about 450–650°C and maintained at subatmospheric pressure. In copending application Ser. No. 127,926 (A. Y. Cho Case 2) filed on Mar. 25, 1971 (now U.S. Pat. No. 3,751,310 issued on Aug. 7, 1973), there is described an MBE technique for doping such Group III(*a*)–V(*a*) thin films with Sn and Si, which act as donors, and with Ge, which is amphoteric depending on whether the growth surface structure is stabilized (i.e., rich) in the Group III(*a*) element ( *p*-type) or the Group V(*a*) element (*N*-type). In addition, in copending application Ser. No. 310,209 (A. Y. Cho-M. B. Panish Case 4–9) filed on Nov. 29, 1972 (now U.S. Pat. No. 3,839,084 issued on Oct. 1,1974) there is described a recent MBE technique for making Group III(*a*)–V(*a*) thin films *p*-type by doping with Mg.

Molecular beam technology, however, is not limited to the epitaxial growth of Group III(*a*)–V(*a*) thin films. During 1970, D. Beecham published in, *Rev. Scientific Instruments*, Vol. 41, p. 1654 experimental results which indicated that thin films of CdS (a II–VI compound) for use as piezoelectric transducers, could be formed by directing molecular beams of Cd and S onto a quartz substrate. On the other hand, in U.S. Pat. 3,666,553 granted to J. R. Arthur, Jr and F. J. Morris (Case 5–2) on May 30, 1972 and assigned to the assignee hereof, there is described a molecular beam technique for fabricating a high sheet resistance polycrystalline, rather than epitaxial, thin film of a Group III(*a*)–V(*a*) compound on an amorphous substrate preheated to a temperature within the range of 250–450°C.

In our attempts to fabricate semiconductor devices which employ epitaxial layers, such as varactors, impatt diodes, junction lasers and light modulators, one recurring problem has been anomalously high series resistance (e.g., 1000 ohms) which is objectionable because it reduces the cut-off frequency of varactors and junction light modulators and reduces the power efficiency of impatts and junction lasers.

SUMMARY OF THE INVENTION

Because commercially usable semiconductor devices should generally have low series resistance (e.g., 2 ohms) for the typical reasons mentioned above, we undertook a detailed study of the MBE process to determine the origin of the high series resistance. Our investigation uncovered in the devices the existence of thin, high resistance regions (hereinafter termed "*i*-layers") at, most typically, the interface between contiguous epitaxial layers. At first the cause of such *i*-layers was unknown. With further investigation, however, we discovered that *i*-layers formed at the interface with the substrate and within the epitaxial layers whenever the growth process was interrupted. Although the exact origin of *i*-layer formation is still unclear, we theorize that their occurrence could result from one or more of the following three factors:

1. First, the upper or growth surface of GaAs for example, during growth, has dangling bonds (e.g., ionic or covalent) with atoms arranged in an As-stabilized surface structure. However, when growth is interrupted, the top monolayer of As is evaporated from the surface and the remaining atoms rearrange themselves to form a Ga-stabilized surface structure having a periodicity different from the bulk or underlying layer (see *Journal of Applied Physics*, Vol. 41, p. 2780 (1970) by A. Y. Cho). Thus, an As-stabilized surface structure changes into a Ga-stabilized surface structure upon heating in a vacuum (see *Journal of Applied Physics*, Vol. 42, p. 2074 (1971) by A. Y. Cho). In addition, at the initial growth of GaAs by MBE, the Ga-stabilized structure converts back to the As-stabilized surface structure. If some of the bonds are not satisfied in the process of conversion, defects (e.g., vacancies) and interface states will be formed. These defects may trap carriers and thereby form an *i*-layer. This conclusion is supported by doping profile measurements of epitaxial layer(s) interrupted during growth by closing the shutter (several times for different intervals) in our vacuum chamber so as to prevent the molecular beam from impinging on the growth surface. Although the system was set to produce a constant arrival rate for the dopant beam, and hence a constant doping profile, we observed that each time growth was interrupted the net carrier concentration decreased by an amount dependent on the time for which the shutter was closed, e.g., growth was stopped. The longer the interruption interval, the greater was the number of defects or traps/$cm^2$ created at the interface until saturation occurred at about $10^{12}/cm^2$.

2. Second, we have observed the evaporation of As from GaAs substrate surfaces when the substrate (usually doped *n*-type with Si) is heated in a vacuum (see, *Journal of Applied Physics*, Vol. 42, supra). The evaporation of As causes the formation of arsensic vacancies, and/or allows Si atoms (or other amphoteric dopant) to migrate to the As sites, resulting in more compensated layers having higher resistance. This conclusion was obtained from experiments in which we heated the substrate in a vacuum and then observed the reduction of net carrier concentration at the surface by Schottky barrier doping profile measurements.

3. Third, impurity contamination due to improper or inadequate cleaning of the substrate can result in an *i*-layer at the substrate surface. This effect was evidenced by the detection of carbon contamination on GaAs substrates with an Auger electron spectrometer. (See, *Journal of Applied Physics*, Vol. 43, p. 5118 (1972) by A. Y. Cho and M. B. Panish). The carbon is not removed by preheating the substrate and even carefully prepared substrate surfaces often had about 0.01 monolayer of carbon (about $10^{13}/cm^2$).

We have improved upon the basic MBE process, however, to the extent that we are able to fabricate semiconductor devices having acceptable series resistances (e.g., 2–5 ohms) and in which *i*-layers are virtually non-existent, or where extant, are so thin as not to be objectionable or detectable by presently available equipment. In accordance with one embodiment of our invention for fabricating GaAs devices, the following steps are performed: (a) in order to reduce, and for most practical purposes eliminate, the *i*-layer at the substrate interface, a high conductivity layer, of the same conductivity type as the substrate, is grown thereon; (*b*) in order to suppress the evaporation of As from the substrate and to eliminate the change of a Ga-stabilized substrate surface structure to an As-stabilized surface structure, the substrate is not heated prematurely, i.e., it is heated just prior to deposition, and under excess As pressure so that the substrate surface remains As-stabilized; and, (c) in order to eliminate the formation of *i*-layers within the device, the growth process must be continuous beginning with the high conductivity layer formed in step (a) above until all layers of the device are grown.

Of course, analogous steps apply to the fabrication of semiconductor devices comprising materials other than Group III(*a*)–V(*a*) compounds, e.g., Group II–VI compounds in which the previous comments regarding the Group III(*a*) and Group V(*a*) elements apply, respectively, to the Group II and Group VI elements. In general, therefore, MBE is applicable to the growth of thin films of semiconductor material of a compound A B, where A is at least one element having a low vapor pressure (e.g., a Group II or III(*a*) element) and B is at least one element having a relatively higher vapor pressure (e.g., a Group V(*a*) or VI element).

BRIEF DESCRIPTION OF THE DRAWING

Our invention, together with its various features and advantages, can be easily understood from the following more detailed description taken in conjunction with the accompanying drawing, in which.

DETAILED DESCRIPTION

Apparatus

Figure 1:
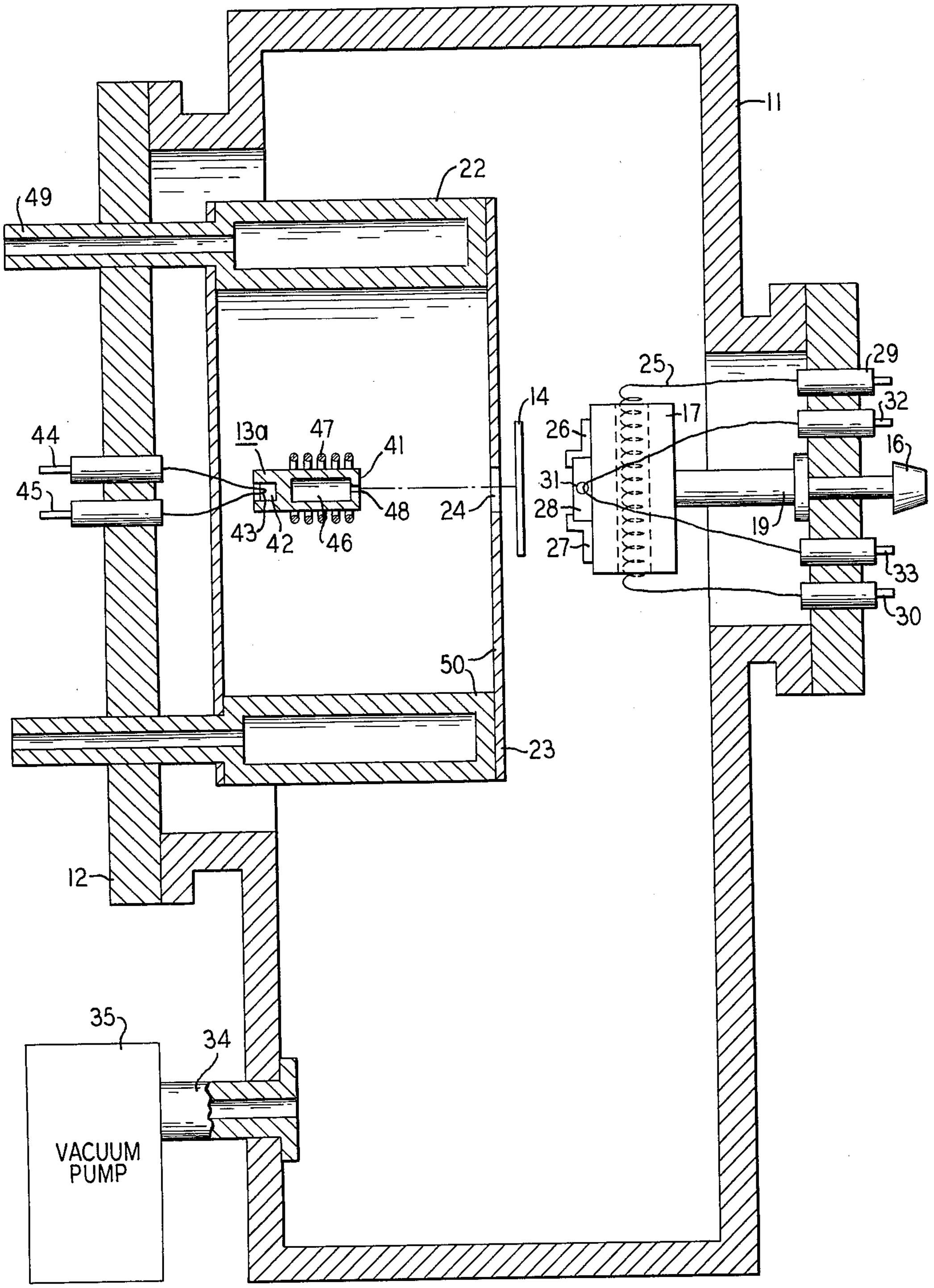
FIG. 1 (PRIOR ART)
FIG. 1 is a partial cross-sectional view of illustrative apparatus utilized in practicing our invention.
Figure 2:
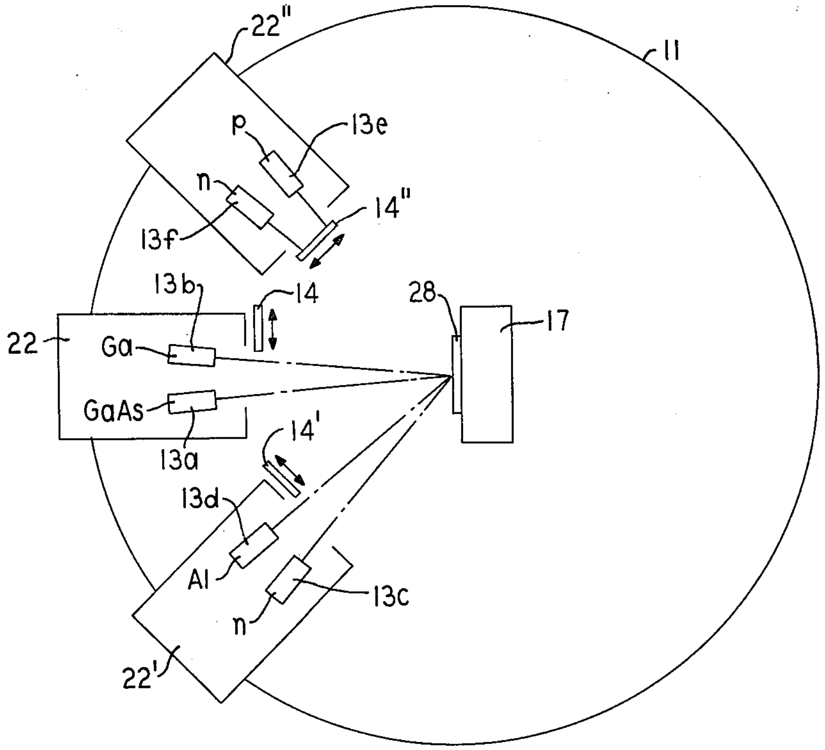
FIG. 2 is a schematic top view of apparatus of the type shown in FIG. 1.

Turning now to FIGS. 1 and 2, there is shown apparatus for growing by MBE epitaxial thin films of semiconductor compounds of controllable thickness and conductivity type.

The apparatus comprises a vacuum chamber 11 having disposed therein a gun port 12 containing illustratively six cylindrical guns 13*a–f*, typically Knudsen cells, thermally insulated from one another by wrapping each cell with heat shielding material now shown (e.g., five layers of 0.5 mil thick knurled Ta foil). A substrate holder 17, typically a molybdenum block, is adapted for rotary motion by means of shaft 19 having a control knob 16 located exterior to chamber 11. Each pair of guns (13*a–b*, 13*c–d*, 13*e–f*) are disposed within cylindrical liquid nitrogen cooling shrouds 22, 22′ and 22″ respectively. A typical shroud includes an optional collimating frame 23 having a collimating aperture 24. A movable shutter 14 is utilized to block aperture 24 at preselected times when it is desired that a particular molecular beam not impinge upon the substrate. Substrate holder 17 is provided with an internal heater 25 and with clips 26 and 27 for affixing a substrate member 28 thereto. Additionally, a thermocouple is disposed in aperture 31 in the side of substrate 28 and is coupled externally via connectors 32–33 in order to sense the temperature of substrate 28. Chamber 11 also includes an outlet 34 for evacuating the chamber by means of a pump 35.

A typical cylindrical gun 13*a* comprises a refractory crucible 41 having a thermocouple well 42 and a thermocouple 43 inserted therein for the purpose of determining the temperature of the material contained in the gun source chamber 46. Thermocouple 43 is connected to an external detector (not shown) via connectors 44-45. Source material is inserted in source chamber 46 for evaporation by heating coil 47 which surrounds the crucible. The end of crucible 41 adjacent aperture 24 is provided with a knife edge opening 48 having a diameter preferably less than the average mean free path of atoms in the source chamber. Illustratively, gun 13*a* is 0.65 cm in diameter, 2.5 cm in length, is constructed of $Al_2O_3$ and is lined with spectroscopically pure graphite. The area of opening 48 is typically about 0.17 $cm^2$.

GENERAL MBE TECHNIQUE

For the purpose of illustration only, the following description relates to the epitaxial growth of a thin film of a Group III(*a*)–V(*a*) compound on a GaAs substrate. The growth of other compounds (e.g., II–VI) on other substrates (e.g., mica) is accomplished in an analogous fashion, as mentioned before.

The first step in a typical MBE technique involves selecting a single crystal substrate member, such as GaAs, which may readily be obtained from commercial sources. One major surface of the GaAs substrate member is initially cut typically along the (001) plane and polished with diamond paste, or any other conventional technique, for the purpose of removing the surface damage therefrom. An etchant such as a bromine-methanol or hydrogen peroxide-sulphuric acid solution may be employed for the purpose of further purifying the substrate surface subsequent to polishing.

Next, the substrate is placed in an apparatus of the type shown in FIGS. 1 and 2, and thereafter, the background pressure in the vacuum chamber is reduced to less than $10^{-6}$ Torr and preferably to a value in the range of about $10^{-8}$ to $10^{-10}$ Torr, thereby precluding the introduction of any deleterious components onto the substrate surface. Since, however, the substrate surface may be subject to atmospheric contamination before being mounted into the vacuum chamber, the substrate is preferably heated, e.g., to about 600°C, to provide a substantially atomically clean growth surface (i.e., desorption of contaminants such as S, $O_2$ and $H_2O$). The next steps in the process involve introducing liquid nitrogen into the cooling shrouds via entrance ports 49 and heating the substrate member to the growth temperature which typically ranges from about 450 to 650°C dependent upon the specific material to be grown, such range being dictated by considerations relating to arrival rates and surface diffusion.

The guns 13*a–f*, employed in the system, have previously been filled with the requisite amounts of the constituents of the desired film to be grown, e.g., gun 13*a* contains a Group III(*a*)–V(*a*) compound such as a GaAs in bulk form; gun 13*b* contains a Group III(*a*) element such as Ga; guns 13*e* and 13*f* contain an *n*-type dopant such as Sn, Si or Ge in bulk form and; gun 13*c* contains a *p*-type dopant such as Mg or Ge. In the practice of our present invention, if it were desired to grow a mixed crystal such as AlGaAs, gun 13*d* containing Al would also be used. The manner in which Sn and si are used as *n*-type dopants and Ge is used an amphoteric dopant in the growth of Group III(*a*)–V(*a*) compounds by MBE is disclosed by A. Y. Cho in copending application Ser. No. 127,926 (Case 2) filed on Mar. 25, 1971 (now U.S. Pat. No. 3,751,310 issued on Aug. 7, 1973). On the other hand, the manner in which Mg is used as a p-type dopant in the growth of Group III(*a*-)–V(*a*) compounds containing Al is disclosed by A. Y. Cho and M. B. Panish in copending application Ser. No. 310,209 (case 4-9) filed on Nov. 29, 1972 (now U.S. Pat. No. 3,839,084 issued on Oct. 1, 1974).

Following, selected ones of the guns are heated to suitable temperature (not necessarily all the same) sufficient to vaporize (by sublimation or evaporation) the contents thereof to yield (with selected ones of the shutters open) a molecular beam (or beams); that is, a stream of atoms manifesting velocity components in the same direction, in this case toward the substrate surface. The atoms or molecules which do not pass through aperture 24 are condensed on the interior surfaces 50 of the shrouds 22 and the collimating frames 23, whereas those which pass through the apertures 24 and which are reflected from the substrate surface are condensed primarily on the exterior cooled surface of the frames 23, thereby insuring that only atoms or molecules from the molecular beam directly (and not spurious reflected atoms) impinge upon the substrate surface. The distances from the guns to the substrate is typically about 5.5 cm for a growth area of 1.5 cm × 1.5 cm. Under these conditions growth rates from 1000 Angstroms/hr. to 2 $\mu$/hr., can readily be achieved by varying the temperature of the Ga gun from about 1110 to 1210° K.

In general the amount of source materials (e.g., Ga, Al and GaAs) furnished to the guns and the gun temperatures should be sufficient to provide an excess of the higher vapor pressure Group V(*a*) elements (e.g., As) with respect to the lower vapor pressure Group III(*a*) elements (e.g., Al and Ga); that is, the surface should be As-rich (also referred to As-stabilized). This condition arises from the large differences in sticking coefficient at the growth temperature of the several materials; namely, unity for Ga and Al and about $10^{-2}$ for $As_2$ on a GaAs surface, the latter increasing to unity when there is an excess of Ga (and/or Al) on the surface. Therefore, as long as the $As_2$ arrival rate is higher than that of Ga and/or Al, the growth will be stoichiometric. Similar considerations apply to Ga and $P_2$ beams impinging, for example, on a GaP substrate, as well as to Cd and S beams impinging, for example, on a mica substrate.

Growth of the desired doped epitaxial film is effected by directing the molecular beam generated by the guns at the collimating frames 23 which function to remove velocity components therein in directions other than those desired (i.e., it narrows the beams emanating from knife edge openings 48), thereby permitting the desired beams to pass through the collimating apertures 24 to effect reaction at the substrate surface. Growth is continued for a time period sufficient to yield an epitaxial film of the desired thickness. This technique permits the controlled growth of films of thickness ranging from a single monolayer (about 3 Angstroms) to more than 100,000 Angstroms. Note, that the collimating frames serve also to keep the vacuum system clean by providing a cooled surface on which molecules (especially $As_2$) reflected from the growth surface can condense. If the effusion cell provides sufficient collimation of the beams, however, the collimating frame is not essential to the growth technique.

The reasons which dictate the use of the aforementioned temperature ranges can be understood as follows. Taking Group III(*a*)–V(*a*) compounds as an example, it is now known that Group III(*a*)–V(*a*) elements, which are adsorbed upon the surface of single crystal semiconductors, have different condensation and sticking coefficients as well as different adsorption lifetime. Group V(*a*) elements typically are almost entirely reflected in the absence of III(*a*) elements when the substrate is at the growth temperature. However, the growth of stoichiometric III(*a*)–V(*a*) semiconductor compounds may be effected by providing vapors of Group III(*a*) and V(*a*) elements at the substrate surface, an excess of Group V(*a*) element being present with respect to the III(*a*) elements, thereby assuring that the entirety of the III(*a*) elements will be consumed while the nonreacted V(*a*) excess is reflected. In this connection, the aforementioned substrate temperature range is related to the arrival rate and surface mobility of atoms striking the surface, i.e., the surface temperature must be high enough (e.g., greater than about 450° C. that impinging atoms retain enough thermal energy to be able to migrate to favorable surface sites (potential wells) to form the epitaxial layer. The higher the arrival rate of these impinging atoms, the higher must be the substrate temperature. On the other hand, the substrate surface temperature should not be so high (e.g., greater than about 650° C. that noncongruent evaporation results. As defined by C. D. Thurmond in *Journal of Physics Chem. Solids*, 26, 785 (1965), noncongruent evaporation is the preferential evaporation of the V(*a*) elements from the substrate eventually leaving a new phase containing primarily the III(*a*) elements. Generally, therefore congruent evaporation means that the evaporation rate of the III(*a*) and V(*a*) elements are equal. The temperatures of the cell containing the III(*a*) element and the cell containing the III(*a*)–(*a*) compound, which provides a source of V(*a*) molecules, are determined by the desired growth rate and the particular III(*a*)–V(*a*) system utilized.

As mentioned previously, similar comments apply to the growth of thin films of a compound AB, where A is at least one element having a low vapor pressure (e.g., a Group II or III(*a*) element) and B is at least one other element having a relatively higher vapor pressure (e.g., a Group VI or V(*a*) element.)

EXPERIMENTAL DATA

Figure 3:
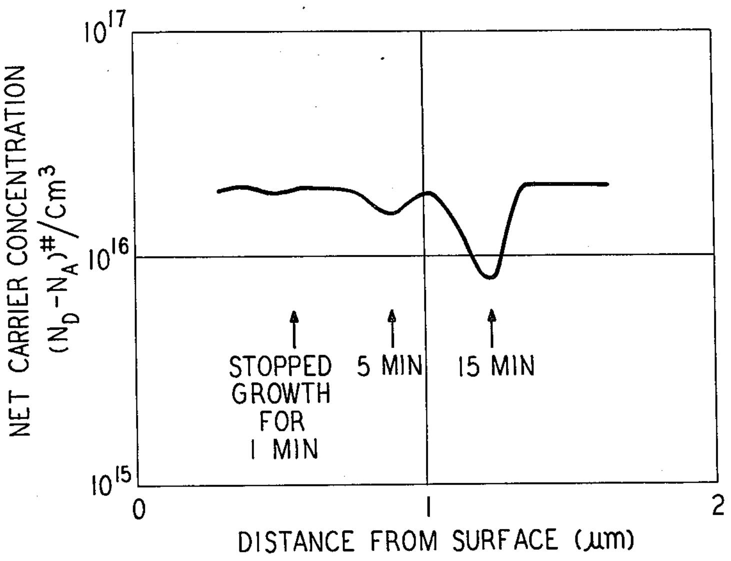
FIG. 3 is a graph showing how the net carrier concentration in an epitaxial layer is reduced as a function of the time for which growth is interrupted.

As discussed previously, use of prior MBE techniques (viz., the Arthur patent, supra) led to anomalously high series resistance in GaAs semiconductor devices. We found that this high resistance, of the order of 1000 ohms, resulted from the formation of *i*-layers (regions of low net carrier concentration) at the substrate-epi interface and/or at any time that growth was interrupted. In prior MBE apparatus, interruption of growth typically occurred whenever it was desired to change the layer composition (e.g., from GaAs to AlGaAs) or its conductivity type (e.g., *n*-type to *p*-type) because all guns were located in a single cooling shroud having a single shutter. To switch from growing a GaAs layer to growing a contiguous AlGaAs, it was necessary to close the shutter, thus interrupting growth, in order to allow the Al gun to be brought up to the sublimation temperature at which time the shutter could again be opened. This procedure might take typically 5 to 15 minutes. Similarly to switch from growing an *n*-type layer to growing a *p*-type layer, it was necessary to close the shutter in order to allow the gun containing the *n*-type dopant to cool below, and the gun containing the *p*-type dopant to heat above, their respective sublimation temperatures. Note that these changes could not occur with the shutter open otherwise the desired abrupt changes in composition and/or doping between contiguous layers could not be effected. Our investigations clearly demonstrated the deleterious effect of interrupting growth. We grew several GaAs layers doped *n*-type with Sn by maintaining the Sn-arrival rate constant (i.e., the Sn-gun temperature constant so that the net carrier concentration $\Delta N=(N_D-N_A)$ should have been uniform throughout the thickness of the layer. In a typical example, shown in FIG. 3, the Sn-gun temperature was maintained constant at 795° K. during the growth of a 1.6 $\mu$ thick layer of GaAs so that ΔN should have been about $2 \times 10^{16}/cm^3$ throughout. Growth took place on an *n*-type GaAs substrate doped with Si to $2 \times 10^{18}/cm^3$ and maintained at 560° C. However, growth was interrupted at three stages and for a different duration each time: first, for 1 minute resulting in a small decrease in ΔN to about $1.8 \times 10^{16}/cm^3$; second, for 5 minutes resulting in a larger decrease in ΔN to about $1.5 \times 10^{16}/cm^3$; and third, for 15 minutes resulting in a still larger decrease in ΔN to about $8 \times 10^{15}/cm^3$.

Thus, it is apparent that the decrease in ΔN is related to the length of time that the growth process is interrupted. Although the decrease in ΔN was about $1.2 \times 10^{16}/cm^3$ for a 15 minute interruption, we also observed larger decreases of $6 \times 10^{16}/cm^3$ for a 1.5 hour interruption. This data implies that if one were growing an *n*-type GaAs epitaxial layer with a carrier concentration of $1 \times 10^{16}/cm^3$ (typical of varactors and impatts), and the MBE growth process was interrupted for 15 minutes to 1.5 hours with the substrate held at 560° C., then an *i*-type or even a *p*-type layer could be formed, resulting in both cases in high series resistance. To overcome this problem, we have modified the standard MBE apparatus (viz., Arthur 3, supra) to the one depicted in FIG. 2 which permits continuous growth.

Figure 4:
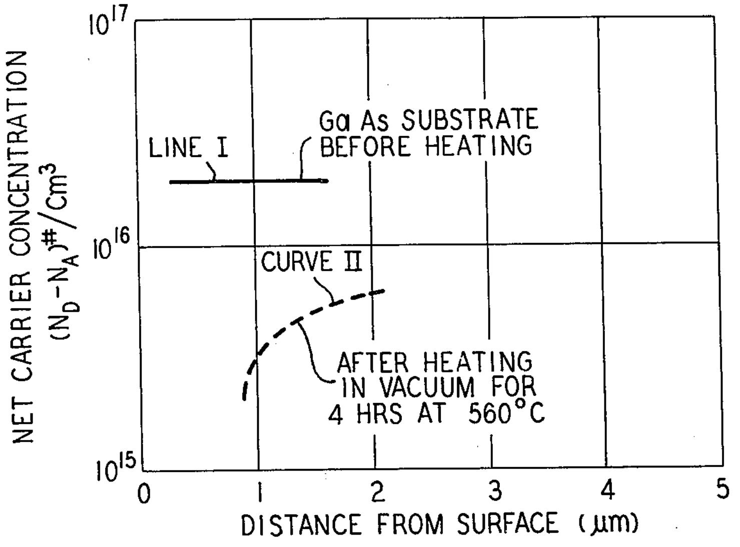
FIG. 4 is a graph showing how the net carrier concentration at the substrate surface is reduced with annealing.

The second factor contributing to high series resistance, *i*-layers formed at the substrate-epitaxial layer interface, is easily understood with reference to FIG. 4, a graph of net carrier concentrating profile in the substrate before and after heating in a vacuum. Before heating, the substrate (obtained from commercial sources) was uniformly doped *n*-type with Si to $\Delta N = 2 \times 10^{16}/cm^3$ as depicted by line I. After heating to 560° C. (a typical growth temperature) in a vacuum (i.e., in chamber 11 at $10^{-8}$ Torr) for 4 hours, ΔN decreased and became nonuniform, ranging from about $2 \times 10^{15}/cm^3$ at a point 1 $\mu m$ from the surface to $6 \times 10^{15}/cm^3$ at 2 $\mu m$ from the surface. The decrease in ΔN is smaller for shorter annealing times but still results in *i*-layer formation. The effect of high resistance formation is smaller, however, if the substrate is doped in the $10^{18}/cm^3$ range. Depending upon the thickness and carrier concentration of the first epitaxial layer (buffer layer) grown on the substrate, the annealing-induced decrease in ΔN often resulted in objectionable *i*-layers contributing to high series resistance.

In accordance with one embodiment of our invention, high series resistance in MBE-grown multilayered GaAs semiconductor devices is virtually eliminated by one or more of the following steps which modify the basic MBE technique.

a. The substrate is heated just prior to growth and under excess As pressure; that is, the pressure in chamber 11 is reduced to about $1.5 \times 10^{-8}$ Torr and then the GaAs gun 13*a* is heated to about 1160° K. to produce sublimation (vaporization). Even with shutter 14 closed, the background pressure of As in the chamber increases to about $1.5 \times 10^{-7}$ Torr, thus establishing excess As pressure. Alternatively, a separate gun could be used to produce an As molecular beam allowed to impinge upon the substrate during the preheating period. Thus, a 20 mil thick GaAs substrate (doped *n*-type with Si to $2 \times 10^{18}/cm^3$) is heated until its temperature reaches the growth temperature, preferably about 560° C. Usually it takes about 3 minutes to reach this temperature. Because the annealing time is comparatively short and because annealing takes place under excess As pressure, little change in net carrier concentration at the substrate surface occurs.

We believe this procedure substantially reduces the number of traps or defects created at the substrate-epitaxial layer interface by suppressing the evaporation of As from the substrate and by eliminating the change of the Ga-stabilized substrate surface structure to an As-stabilized surface structure.

b. During the previous step (a), the Ga-gun 13*b* and the *n*-type gun 13*f* (containing Sn) were heated to approximately 1200 and 935° K., respectively (alternatively gun 13*c* could be used instead of, or in conjunction with, gun 13*f*). When the substrate reaches 560° C., shutters 14 and 14'' (or alternatively 14 and 14') are opened to allow Ga, $As_2$ and Sn molecular beams to impinge upon the substrate surface, thereby effecting growth of a high conductivity (e.g., $2 \times 10^{18}/cm^3$) *n*-type buffer layer of Sn-doped GaAs about 1 $\mu m$ thick on the substrate surface.

Experimental data indicates that the reduction of carrier concentration at the substrate surface due to preheating prior to growth is much less than $2 \times 10^{16}/cm^3$ for typical preheating times (about 3 minutes). Therefore, as long as the carrier concentration of the buffer layer exceeds $2 \times 10^{16}/cm^3$, the carriers in the region of the substrate surface will not be completely depleted and objectionable *i*-layers will be eliminated. The low series resistance (2–3 ohms) of devices grown in this manner substantiates our conclusion.

c. The desired semiconductor device is now grown on the buffer layer. In order to avoid reductions in carrier concentration due to interrupted growth, however, the growth process is made to be continuous beginning with the growth of the buffer layer and until all layers of the device are fabricated.

Continuous growth is effected by leaving shutter 14 open with GaAs-guns 13*a* and Ga-gun 13*b* heated to produce molecular beams of Ga and $As_2$ during the entire growth process.

Devices so grown manifest suitable low series resistances of the order of 2–3 ohms, whereas those fabricated by previous MBE techniques, in which the growth process was interrupted, exhibited series resistances three orders of magnitude larger (e.g., 1000 ohms).

DOUBLE HETEROSTRUCTURE FABRICATION

Figure 6:
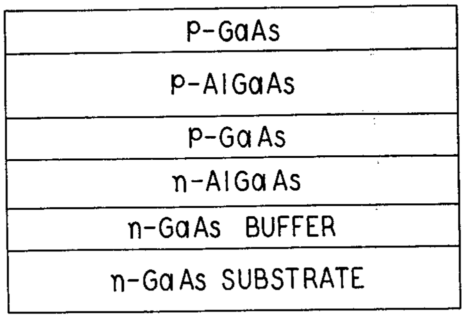
FIG. 6 is a schematic side view of a double heterostructure fabricated in accordance with an illustrative embodiment of our invention.

In order to effect continuous growth, we modified our MBE apparatus as shown in FIG. 2. The manner in which this apparatus is used to fabricate the AlGaAs double heterostructure shown in FIG. 6 will be given with reference to the following table.

| Step | Shutters Open | Guns Heated To Sublimation | Description |
|---|---|---|---|
| 1 | none | 13a — Ga<br>13b — GaAs<br>13f — Sn | produce excess As pressure at substrate, preheat to 560 deg. C. |
| 2 | 14,14'' | 13a, 13b, 13f<br>13c — Sn (preheat)<br>13d — Al (preheat) | grow n—GaAs buffer layer |
| 3 | 14, 14' | 13a, 13b, 13c, 13d<br>13e — Mg (preheat) | grow n—AlGaAs layer |
| 4 | 14, 14'' | 13a, 13b, 13e<br>13d — Al (preheat) | grow p—GaAs |
| 5 | 14, 14', 14'' | 13a, 13b, 13d, 13e | grow p—AlGaAs |
| 6 | 14, 14'' | 13a, 13b, 13e | grow p—GaAs |

Note that during all growth steps (2–6) shutter 14 is open and GaAs-gun 13*a* and Ga-gun 13*b* are heated to sublimation (vaporization), thereby effecting continuous growth. In step 3, Mg-gun 13*e* is preheated with shutter 14'' closed in anticipation of the growth of a *p*-type layer in step 4. Such preheating permits an abrupt change between contiguous layers of opposite conductivity type by substantially simultaneously closing shutter 14' and opening shutter 14'' as the process proceeds from step 3 to 4 without interrupting the growth process. Similarly, in steps 2 and 4 Al-gun 13*d* is preheated in anticipation of the growth of AlGaAs in steps 3 and 5, thereby allowing an abrupt change of composition between contiguous layers.

The layers of double heterostructures so fabricated are typically doped in the range of $5 \times 10^{17}$ to $5 \times 10^{18}/cm^3$ for junction lasers which is probably partly effective to reduce the effects of *i*-layer formation when fabricated in accordance with our invention. The problem of *i*-layer formation becomes more severe when fabricating devices such as double heterostructure light modulators of the type described by F. K. Reinhart in copending application Ser. No. 193,286 (Case 2) filed on Oct. 28, 1971 (now U.S. Pat. No. 3,748,597 issued on July 24, 1973. These modulators typically require net carrier concentrations of the same order as the magnitude of the reduction in net carrier concentration produced by the aforementioned factors; i.e., net carrier concentrations of the order of $10^{16}/cm^3$. Other classes of such devices are voltage variable capacitors and impatt diodes.

VOLTAGE VARIABLE CAPACITOR FABRICATION

Figure 5:
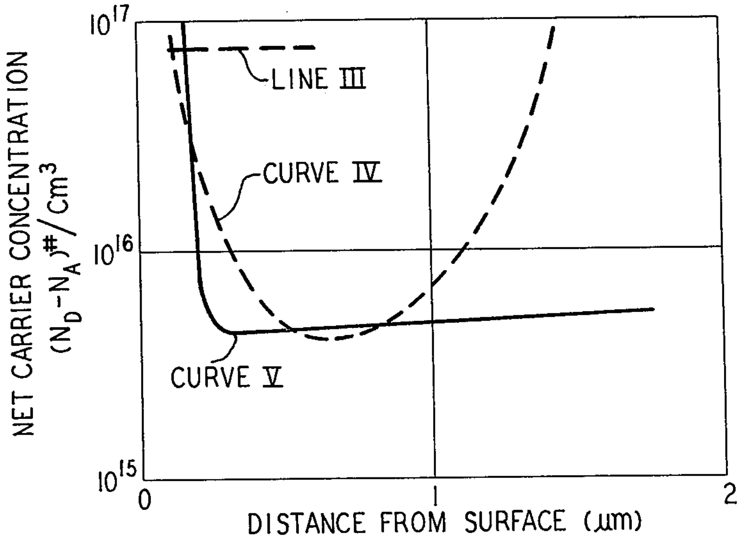
FIG. 5 is a graph showing illustrative doping profiles attainable in accordance with our invention.

Utilizing MBE techniques in accordance with our invention and by programming the intensity of the dopant molecular beam, we have demonstrated that microwave GaAs devices can be fabricated with low series resistances in the order of 2–3 ohms and with doping profiles which conform to virtually any predetermined function such as $$\Delta N = kx^m \qquad (1)$$

where $\Delta N = N_D - N_A$, the net carrier concentration, $k$ is a constant, $x$ is distance or thickness of the doped layer of interest and $m$ is any real number. Thus, as shown in FIG. 5, we have fabricated GaAs layers having various $\Delta N$ profiles: Line III is a constant profile ($m=0$); Curve IV is a nonlinear profile in which $m=-1.5$ approximately in the vicinity of the surface of the epitaxial layer; and Curve V is a profile of an abrupt reduction in $\Delta N$ with increasing $x$.

Some of the many applications of these profiles are, for instance: Line III — a common varactor; Curve IV — a hyperabrupt varactor used for tuning, mixing and parametric amplification; Curve V — a snap varactor used for harmonic generation and waveshaping or an impatt diode used as a microwave oscillator. A general discussion of varactors can be found in *Physics of Semiconductor Devices* by S. M. Sze, Wiley Interscience, John Wiley & Sons, Inc. (1969), Chapter 3, pp. 133–136. Briefly, however, a varactor can be characterized by two important parameters; its capacitance C and its series resistance $R_s$ which together define its cut-off frequency $f_{co}$ given by $$f_{co} = \frac{1}{2\pi R_s C} \qquad (2)$$

It is clear that for high cut-off frequencies the varactor should have low $R_s$ and C. C is governed by the geometry of the device and dielectric constant of the material from which the device is made. Utilizing mesa structures, for example, reduces C. On the other hand, the fundamental limitation of $R_s$ is governed by the mobility of the material where higher mobility gives lower $R_s$. But, high $R_s$ can also result from *i*-layer formation as previously mentioned.

As pointed out by Sze, supra, of particular interest is the hyperabrupt profile where $$\Delta N = kx^{-3/2} \qquad (3)$$

and the capacitance is related to the applied voltage V as $$V \propto C^{-1/2} \qquad (4)$$

Note that in Sze the varactor employs a *p-n* junction under reverse bias whereas in an example to be described hereinafter we employed a Schottky barrier contact instead. In the latter case $$(V_b - V_a) \cong C^{-1/2} \quad (5)$$

where $V_a$ is the applied bias voltage and $V_b$ is the barrier height.

In either case, however, the resonant frequency $f_r$ produced by placing the varactor in a reactive circuit including a voltage independent series inductance L is given by $$f_r = \frac{1}{2\pi}(LC)^{-1/2} \quad (6)$$

$$f_r = \frac{1}{2\pi}(L)^{-1/2}(V_b - V_a) \quad (7)$$

Thus, the resonant frequency is linearly proportional to the applied bias voltage $V_a$ for a fixed L and $V_b$. This kind of device behavior is useful in tuning, frequency modulation and the elimination of distortion.

Figure 7:
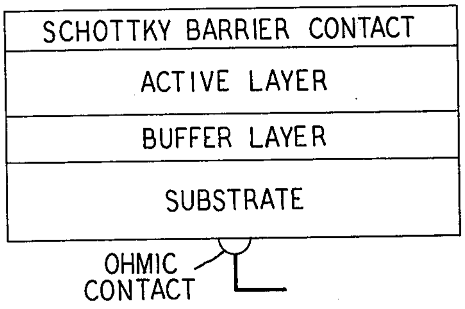
FIG. 7 is a schematic side view of a varactor fabricated in accordance with an illustrative embodiment of our invention.

Utilizing the techniques of our invention, we have fabricated hyperabrupt varactors of the type depicted in FIG. 7 comprising a GaAs substrate about 20 mils thick doped *n*-type with Si to $2 \times 10^{18}/cm^3$ (obtained from commercial sources). On the substrate was grown in accordance with our MBE process a 1 $\mu$m thick buffer layer of GaAs doped *n*-type with Sn to about $2 \times 10^{18}/cm^3$. Without interrupting growth, we then grew a 1–2$\mu$m thick active layer of GaAs doped *n*-type with Sn. The intensity of the Sn beam was controlled to produce the doping profile shown by Curve IV of FIG. 5. Contacts were then made to the device: the substrate contact was formed by sparking a Sn-doped Au wire to form an alloy point contact; the active layer contact (a Schottky barrier) was formed by evaporating about 1500 Angstroms of Au through a Mo mask having circular apertures of various diameters (e.g., 5, 10, 20 mils). The performance of devices of this type were evaluated and were shown to have series resistances of about 2–3 ohms and cut-off frequencies in excess of 20 GHz. Capacitance variations of a factor of 10 have been achieved with less than 3 volts bias change.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

What is claimed is:

1. A method for epitaxially growing upon a substrate a semiconductor device including at least one epitaxial layer of a material having a composition AB, where A is at least one Group III(*a*) element having a low vapor pressure and B is at least one Group V(*a*) element having a relatively higher vapor pressure, comprising the steps of:

a. reducing the background pressure to a subatmospheric pressure;

b. preheating said substrate to a predetermined temperature;

c. directing at least one molecular beam comprising A, B and a dopant at said substrate for a time period sufficient to effect growth of said at least one epitaxial layer of the desired thickness; said predetermined temperature being effective to allow atoms impinging thereon to migrate to surface sites to form said at least one epitaxial layer and effective to produce congruent evaporation of said A elements and said B elements;

d. maintaining the relative proportions of the constituents of said at least one molecular beam so that at the growth surface there is an excess of said B elements with respect to said A elements, and characterized in that:

1. prior to step (c) a first molecular beam(s) is directed upon said substrate to effect growth thereon of a high conductivity buffer layer of the same conductivity type and material as the substrate;
2. beginning with step (1) and until said buffer layer and all of said at least one epitaxial layers are grown, at least one beam including an element of A and B at all times impinges on the growth surface so that said growth process is continuous; and
3. during step (b) said preheating takes place in a gaseous atmosphere which includes an element of B.

2. The method of claim 1 wherein said substrate is preheated to a temperature in the range of about 450 to 650° C.

3. The method of claim 2 wherein said at least one epitaxial layer comprises $Al_xGa_{1-x}As$, $0 \leq x \leq 1$.

4. The method of claim 2 wherein the substrate comprises GaAs and said preheating Step (b) occurs just prior to step (1) and under condition of excess As pressure at said substrate.

5. The method of claim 4 wherein both said substrate and said buffer layer have net carrier concentrations of about $10^{18}/cm^3$.

6. The method of claim 5 wherein said buffer layer comprises GaAs.

7. A method of fabricating a semiconductor device comprising the steps of:

a. performing the steps of claim 6 to fabricate a high conductivity GaAs buffer layer on said GaAs substrate and a relatively lower conductivity active layer on said buffer layer; and b. programming in time the intensity of the dopant in said at least one molecular beam so that a predetermined profile of net carrier concentration $\Delta N$ is produced in said active layer.

8. The method of claim 7 for fabricating a hyperabrupt varactor wherein the intensity of the dopant is programmed so that a profile conforming approximately to the following relationship is formed in said active layer:

$$\Delta N = kx^{-1.5}$$

where *k* is a constant, and *x* is the distance into said active layer as measured from said buffer layer.

9. The method of claim 8 including the steps of c. forming an ohmic contact to said substrate; and d. forming a Schottky barrier contact to said active layer.

10. The method of claim 8 wherein $\Delta N$ in said active layer ranges between approximately $1 \times 10^{17}/cm^3$ and $4 \times 10^{15}/cm^3$.

11. The method claim 9 wherein said substrate, buffer layer and active layer all have *n*-type conductivity.

12. The method of claim 7 wherein the intensity of the dopant is programmed so that said profile has a region in which the net carrier concentration decreases from about $1 \times 10^{17}/cm^3$ to about $7 \times 10^{15}/cm^3$ over a distance on the order of 5000 Angstroms.

13. The method of claim 12 for fabricating a snap varactor including the additional steps of:

c. forming an ohmic contact to said substrate and d. forming a Schottky barrier contact to said active layer.

14. A method for epitaxially growing upon a GaAs substrate surface a semiconductor device including at least one epitaxial layer of a Group III(*a*)–V(*a*) compound material comprising the steps of:

a. reducing the background pressure to at least $10^{-8}$ Torr approximately;

b. just prior to step (c), preheating the substrate to a temperature in the range of about 450 to 650° C. under a condition of excess As pressure at said surface;

c. directing at least one first molecular beam comprising Ga, As and a dopant upon said surface to effect growth thereon of a high conductivity GaAs buffer layer having a conductivity type the same as that of the substrate;

d. directing at least one second molecular beam comprising a Group III(*a*) element, a Group V(*a*) element and a dopant upon said buffer layer for a time period sufficient to effect growth of said at least one epitaxial layer of the desired thickness and conductivity type;

e. maintaining the relative proportions of the constituents of said first and second molecular beams so that at the growth surface there is an excess of said group V(*a*) elements with respect to said Group III(*a*) elements; and f. beginning with said step (c) and until said buffer layer and all of said at least one epitaxial layers are grown, maintaining at least one beam including an element of A and B at all times impinging on the growth surface so that said growth process is continuous.

15. The method claim 14 wherein said substrate is doped n-type to a net carrier concentration of about $10^{18}/cm^3$ and said first molecular beam is effective to produce an *n*-type GaAs buffer layer doped to a net carrier concentration of about $10^{18}/cm^3$.

16. The method of claim 15 wherein said first molecular beam is directed at said substrate for a time period effective to grow said buffer layer about 1 $\mu$m in thickness.

* * * * *

UNITED STATES PATENT AND TRADEMARK OFFICE

CERTIFICATE OF CORRECTION

PATENT NO. : 3,915,765

DATED : October 28, 1975

INVENTOR(S) : Alfred Y. Cho and Franz K. Reinhart

It is certified that error appears in the above-identified patent and that said Letters Patent are hereby corrected as shown below:

Column 1, line 27, change "N-type" to --n-type--.

Column 3, line 68, change "now" to --not--.

Column 5, line 10, change "13e" to --13c--.

Column 5, line 11, change "13c" to --13e--.

Column 5, line 15, change "si" to --Si--.

Column 6, line 59, change "III(a)-(a)" to --III(a)-V(a)--.

Column 10, equation 4, change "$V \underline{\propto} C^{-1/2}$" to --$V \propto C^{-1/2}$--.

Column 11, equation 5, line 1, change "$(V_b - V_a) \underline{\propto} C^{-1/2}$" to --$(V_b - V_a) \propto C^{-1/2}$--.

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*